United States Patent
Schmölz et al.

(10) Patent No.: US 6,707,705 B2
(45) Date of Patent: Mar. 16, 2004

(54) INTEGRATED DYNAMIC MEMORY DEVICE AND METHOD FOR OPERATING AN INTEGRATED DYNAMIC MEMORY

(75) Inventors: Paul Schmölz, München (DE); Jean-Marc Dortu, München (DE); Robert Feurle, Neubiberg (DE); Andreas Täuber, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/113,413

(22) Filed: Apr. 1, 2002

(65) Prior Publication Data

US 2002/0141229 A1 Oct. 3, 2002

(30) Foreign Application Priority Data

Mar. 30, 2001 (DE) .......................... 101 15 816

(51) Int. Cl.$^7$ ............................... G11C 11/24
(52) U.S. Cl. .................. 365/149; 365/233; 365/203
(58) Field of Search ................ 365/149, 233, 365/103

(56) References Cited

U.S. PATENT DOCUMENTS

| | | | | | |
|---|---|---|---|---|---|
| 5,276,889 A | * | 1/1994 | Shiraishi et al. | ............ | 713/322 |
| 5,930,197 A | * | 7/1999 | Ishibashi et al. | ............ | 365/233 |
| 5,999,197 A | * | 12/1999 | Satoh et al. | ............ | 345/567 |
| 6,115,319 A | * | 9/2000 | Kinoshita et al. | ............ | 365/149 |

FOREIGN PATENT DOCUMENTS

DE 33 33 862 A1 4/1984

* cited by examiner

*Primary Examiner*—Huan Hoang
(74) *Attorney, Agent, or Firm*—Laurence A. Greenberg; Werner H. Stemer; Ralph E. Locher

(57) ABSTRACT

In order to operate an integrated dynamic memory having a memory cell array having bit lines and word lines a plurality of individual actions—to be performed for a memory access—from the activation of one of the word lines up to the precharging of the word lines are controlled in a synchronized manner with a clock signal. A value for defining a defined number of clock cycles between at least two individual actions is programmed at the beginning. For this purpose, a control circuit has a programmable unit. In this way, in conjunction with a clocked circuit, a comparatively high data throughput is made possible even at variable clock frequencies.

5 Claims, 2 Drawing Sheets

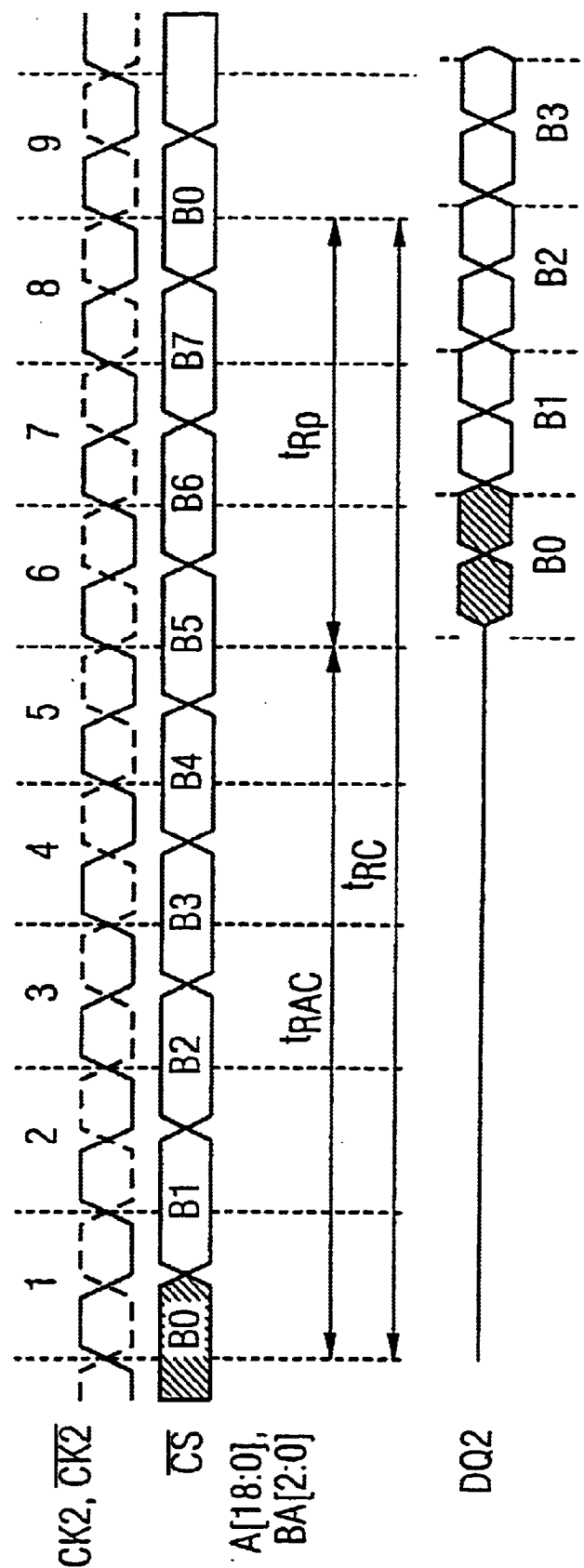

INTEGRATED DYNAMIC MEMORY DEVICE AND METHOD FOR OPERATING AN INTEGRATED DYNAMIC MEMORY

BACKGROUND OF THE INVENTION

FIELD OF THE INVENTION

The present invention relates to an integrated dynamic memory having a memory cell array having bit lines and word lines and having a control circuit for controlling a memory access to the memory cell array, and to a method for operating an integrated dynamic memory.

Integrated memory chips often have synchronously operated circuit sections or terminals to synchronously operated external assemblies, and also asynchronously operated circuit sections, which, for example are connected to one another for a data exchange. The synchronously operated circuit sections are thereby clocked, that is to say there is generally a globally available clock signal present with which the operation of the synchronous circuit section is controlled time-synchronously. In contrast thereto, an asynchronously operated circuit section is not clocked. By way of example, a memory chip has a DRAM memory circuit having a memory cell array with bit lines and word lines and also a control circuit for controlling a memory access to the memory cell array. The circuit sections of the DRAM memory circuit operate essentially asynchronously.

If different circuits which operate synchronously with respect to a clock or asynchronously are used in a data processing system, then it is necessary for defined interfaces to be created between the relevant different circuits. Clocked register circuits are usually used for this. Data from a synchronous circuit are thereby stored in an input register circuit with, for example, the rising edge of the clock signal. The data are transferred from the input register circuit into the relevant DRAM circuit, the data are processed in the DRAM circuit and, after an asynchronous time period, are forwarded to an output register circuit, into which the data are accepted upon the next rising edge of the clock signal. The data of the output register are transferred to a synchronous circuit for further processing.

In this case, in particular, difficulties can arise if the period duration of the clock signal is variable and is not correlated with the data processing duration of the asynchronously operating dynamic memory. Proper operation of the dynamic memory requires the input data to remain the same throughout the entire processing time of the memory, in order to ensure correct processing by the memory. In order to hold the input data for a plurality of clock cycles, it is necessary, for example, to provide an additional register.

If, in such a case, it is stipulated for example that the synchronous circuit processes further the data from the output register circuit of the memory only after a defined number of clock cycles, this can have the consequence that the synchronous circuit must wait for an unnecessarily long time for the processed data of the dynamic memory for further processing (introduction of so-called wait states). This can occur principally in the case of variable clock frequencies of the synchronous circuit and limit the data throughput.

SUMMARY OF THE INVENTION

It is accordingly an object of the invention to provide an integrated dynamic memory device and a method for operating a dynamic memory, which overcomes the above-mentioned disadvantages of the heretofore-known devices and methods of this general type and which provides for an integrated dynamic memory that can communicate with a clocked synchronous circuit and wherein a comparatively high data throughput is thereby made possible even at variable clock frequencies. A further object of the invention is provide a method for operating a dynamic memory which, in conjunction with a clocked circuit, makes possible a comparatively high data throughput even at variable clock frequencies.

With the foregoing and other objects in view there is provided, in accordance with the invention, an integrated memory chip with a dynamic memory, comprising:

a memory cell array having bit lines and word lines;

a control circuit connected to and controlling a memory access to the memory cell array;

the control circuit having a clock input connected to receive a clock signal;

wherein a plurality of individual actions, to be performed by the control circuit for a memory access, from an activation of one of the word lines to a precharging of the word lines, are controlled in synchronicity with the clock signal; and the control circuit having a programmable unit for setting a defined number of clock cycles between at least two of the individual actions.

In other words, the first-mentioned objects are achieved by way of an integrated dynamic memory of the type mentioned in the introduction wherein the control circuit is connected to a terminal for a clock signal. A plurality of individual actions—to be performed by the control circuit for a memory access—from the activation of one of the word lines up to the precharging of the word lines are controlled in a synchronized manner with the clock signal. The control circuit has a programmable unit, which can set a defined number of clock cycles between at least two individual actions.

With the above and other objects in view there is also provided, in accordance with the invention, a method of operating an integrated dynamic memory having a memory cell array with bit lines and word lines, which comprises:

controlling a plurality of individual actions, to be performed for a memory access, from an activation of one of the word lines to a precharging of the word lines, in synchronicity with a clock signal; and programming a value for defining a defined number of clock cycles between at least two individual actions at a beginning.

In other words, the objects relating to the method are achieved by way of a method for operating an integrated dynamic memory having a memory cell array having bit lines and word lines. A plurality of individual actions—to be performed for a memory access—from the activation of one of the word lines up to the precharging of the word lines are controlled in a synchronized manner with a clock signal. A value for defining a defined number of clock cycles between at least two individual actions is programmed at the beginning.

The dynamic memory according to the invention makes it possible to control the performance of a memory access with a clock signal, which is made available for example by a synchronous circuit which communicates with the memory, in such a way that a high data throughput is made possible between the synchronous circuit and the dynamic memory. Since the individual actions—to be performed for a memory access—from the activation of one of the word lines up to the precharging of the word lines are controlled in a synchronized manner with the clock signal, it is possible to avoid so-called wait states in particular in the case of a variable clock frequency. Since the control circuit or the programmable unit can set a defined number of clock cycles between at least two individual actions, the time sequence of a memory access can be adapted to variable clock frequencies.

In accordance with one embodiment of the invention, the number of clock cycles is set in the programmable unit in such a way that the cycle time for a word line access corresponds to an integer multiple of the clock period of the clock signal. As a result, a memory access or the cycle time is optimally adapted to the clock frequency, so that a high data throughput can be obtained.

In accordance with an additional feature of the invention, the integrated memory has a plurality of separate memory cell arrays. The value for defining a defined number of clock cycles is programmed depending on the number of memory cell arrays. In particular, it is advantageous if the value is programmed in such a way that the cycle time for a word line access encompasses a number of clock periods of the clock signal, the number of clock periods corresponding to the number of memory cell arrays.

According to the invention, the value for defining a defined number of clock cycles is programmed at the beginning of operation of the dynamic memory. For the case where the number of clock periods for a word line access corresponds to the number of memory cell arrays, it has been made possible to control respective memory accesses to each of the memory cell arrays in such a way that a memory access to each of the memory cell arrays is triggered within the word line access time (so-called row cycle time). By way of example, the individual memory accesses to the individual memory cell arrays are triggered successively during each clock period of the clock signal. After the memory access to the last of the memory cell arrays has been triggered, a datum to be read out from the memory cell array addressed first can be read out with the next clock period. An optimum utilization of a data bus is therefore made possible in the case of a so-called multi-bank system of this type. The number of clock cycles in a so-called random access of the dynamic memory is adapted to the number of memory cell arrays present in the memory, for example in the form of memory banks.

Other features which are considered as characteristic for the invention are set forth in the appended claims.

Although the invention is illustrated and described herein as embodied in an integrated dynamic memory and method for operating an integrated dynamic memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a signal diagram for a memory access in the case of a memory in accordance with FIG. 2.

DESCRIPTION OF THE PREFERRED EMBODIMENTS

Figure 1:
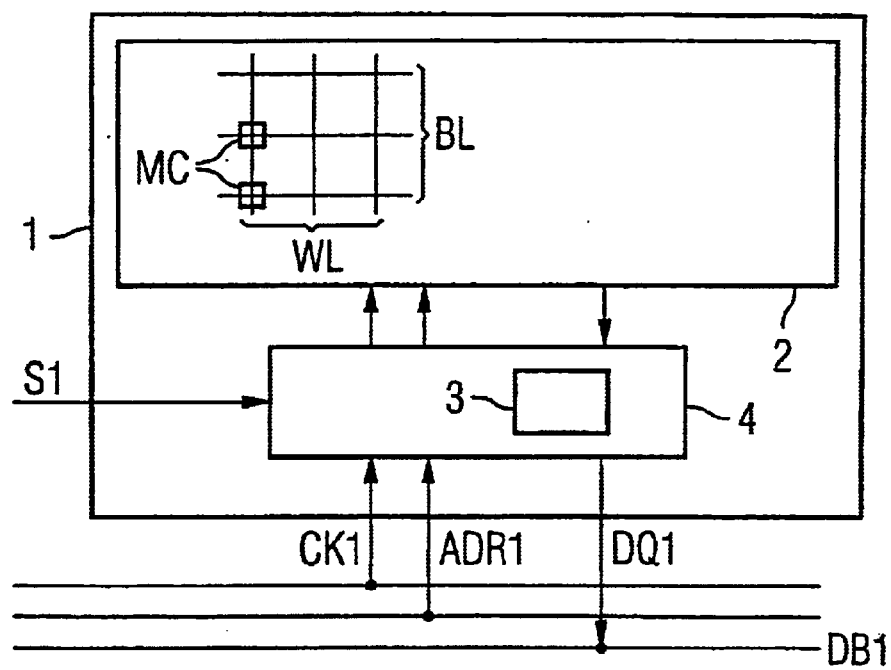
FIG. 1 is a schematic block diagram of a first embodiment of an integrated dynamic memory according to the invention.

Referring now to the figures of the drawing in detail and first, particularly, to FIG. 1 thereof, there is shown an integrated dynamic memory 1 with a memory cell field or array 2. The latter contains bit lines BL and word lines WL in a matrix-type arrangement. Memory cells MC are disposed at the crossover points of the lines BL and WL. The memory cells MC of the memory shown here each comprise a selection transistor and a storage capacitor. Control inputs of the selection transistors are thereby connected to one of the word lines WL, while a main current path of the selection transistors is arranged between the storage capacitor of the respective memory cell MC and one of the bit lines BL. The memory cells MC can each be addressed by means of an address signal ADR1.

The dynamic memory 1 additionally has a control circuit 4 for controlling a memory access to the memory cell array 2. The control circuit 4 is connected to a terminal for a clock signal CK1, which is made available for example by a connected synchronous clocked circuit. The control circuit 4 has a programmable unit 3, which can set a defined number of clock cycles between at least two individual actions which are to be performed in the event of a memory access. The control circuit 4 is driven by control signals S1 for a memory cell access. The signals S1 indicate, for example, a beginning and the type (reading, writing) of a memory access.

The control circuit 4 is embodied in such a way that a plurality of individual actions—to be performed for the memory access—from the activation of one of the word lines WL up to the precharging of the word lines WL are controlled in a synchronized manner with the clock signal CK1. By way of example, the relevant word line WL is activated upon a first clock edge, a local sense amplifier is activated upon a further clock edge, a column address is transferred upon a succeeding clock edge and, after further required individual actions to be performed, the precharging of the word lines is effected upon one of the succeeding clock edges.

According to the invention, a value for defining a defined number of clock cycles between at least two individual actions is programmed at the beginning of operation of the dynamic memory. This enables a memory access to be correspondingly adapted to the new conditions in the case of variable clock frequencies of the clock signal CK1. By way of example, the programmable unit 3 is programmed in such a way that when the clock frequency of the clock signal CK1 is increased, the number of clock cycles between two individual actions is increased correspondingly. At the end of a memory access, the data are read out in the form of data signals DQ1 from the memory cell array 2. These are transferred onto a data bus DB1, which can be utilized optimally on account of the synchronized access control to the dynamic memory.

Figure 2:
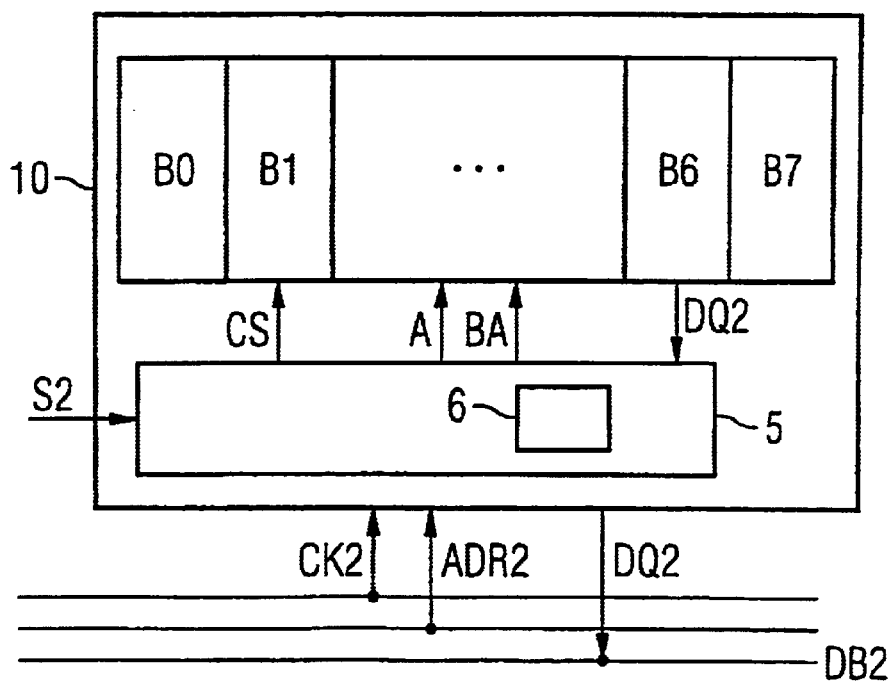
FIG. 2 is a schematic block diagram of a second embodiment of the integrated dynamic memory according to the invention.

FIG. 2 illustrates a further embodiment of a dynamic memory 10 having a plurality of memory cell arrays in the form of memory banks B0 to B7. The memory 10 has a control circuit 5, which, in a similar manner to the memory in accordance with FIG. 1, has a programmable unit 6. The control circuit 5 generates the signals CS, A and BA from the control signals S2. A memory access is controlled using the clock signal CK2 and the address signal ADR2. The data signals DQ2 are read out from the memory and output onto a data bus DB2.

FIG. 3 shows a signal diagram for an exemplary memory access to the memory banks B0 to B7 of the memory 10 illustrated in FIG. 2. With each new clock period of the clock signal CK2, the control signal/CS, the address signal A (having a width of 19 bits) and the bank address BA (having a width of 3 bits) are in each case transferred successively for the memory banks B0 to B7. The cycle time $t_{RC}$ (row cycle time) for a word line access encompasses the number of 8 clock periods. In other words, the number of clock periods corresponds to the number of memory banks B0 to B7. Within the sixth clock period, the data DQ2 are read out for the memory bank B0. The access cycle for the memory bank B0 is concluded with precharging of the corresponding word lines at the end of the time $t_{RC}$.

The row cycle time $t_{RC}$ is composed of the time $t_{RAC}$ (Row Access Time; word lines are activated) and the time $t_{RP}$ (Row Precharge Time; word lines are precharged). These times in each case correspond to an integer multiple of the clock period of the clock signal CK2.

For the case where the clock frequency of the clock signal CK2 changes, the times $t_{RAC}$ and $t_{RP}$ can be correspondingly synchronized with the clock signal CK2 via corresponding programming of the number of clock cycles. When the clock frequency of the clock signal CK2 increases, the times $t_{RAC}$ and $t_{RP}$ can be programmed in such a way that they encompass more clock periods than illustrated in FIG. 3. Since, in the present example, the number of clock periods of the clock signal CK2 for the time $t_{RC}$ corresponds exactly to the number of memory banks, a continuous data stream with a high data throughput can be transferred on the data bus DB2 in accordance with FIG. 2.

We claim:

1. An integrated memory chip with a dynamic memory, comprising:

a memory cell array having bit lines and word lines;

a control circuit connected to and controlling a memory access to said memory cell array;

said control circuit having a clock input connected to receive a clock signal;

wherein a plurality of individual actions, to be performed by said control circuit for a memory access, from an activation of one of said word lines to a precharging of said word lines, are controlled in synchronicity with the clock signal;

said control circuit having a programmable unit for setting a defined number of clock cycles between at least two of the individual actions; and said memory cell array being one of a plurality of separate memory cell arrays and said programmable unit seting the defined number of clock cycles such that a cycle time for a word line access encompasses a number of clock periods of the clock signal corresponding to a number of said memory cell arrays.

2. The integrated memory chip according to claim 1, wherein said programmable unit is configured to set the defined number of clock cycles such that a cycle time for a word line access corresponds to an integer multiple of a clock period of the clock signal.

3. A method of operating an integrated dynamic memory having a memory cell array with bit lines, word lines, and a plurality of separate memory cell arrays, which comprises:

controlling a plurality of individual actions, to be performed for a memory access, from an activation of one of the word lines to a precharging of the word lines, in synchronicity with a clock signal; and programming a value, depending on a number of the memory cell arrays, for defining a defined number of clock cycles between at least two individual actions at a beginning.

4. The method according to claim 3, which comprises programming the value such that a cycle time for a word line access corresponds to an integer multiple of a clock period of the clock signal.

5. The method according to claim 3, which comprises programming the value such that a cycle time for a word line access encompasses a number of clock periods of the clock signal corresponding to the number of memory cell arrays.

* * * * *